(12) United States Patent
Sher et al.

(10) Patent No.: US 6,266,291 B1
(45) Date of Patent: Jul. 24, 2001

(54) VOLTAGE INDEPENDENT FUSE CIRCUIT AND METHOD

(75) Inventors: Joseph C. Sher, Meridian; Nick VanHeel, Eagle, both of ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/256,328

(22) Filed: Feb. 23, 1999

(Under 37 CFR 1.47)

(51) Int. Cl.[7] ....................................... G11C 7/00
(52) U.S. Cl. ........................ 365/226; 365/189.09
(58) Field of Search ............... 365/226, 189.09; 327/541

(56) References Cited

U.S. PATENT DOCUMENTS 5,373,477 * 12/1994 Sugibayashi ................. 365/226
5,552,740 * 9/1996 Casper ......................... 327/541

* cited by examiner

Primary Examiner—Huan Hoang
(74) Attorney, Agent, or Firm—Dorsey & Whitney LLP

(57) ABSTRACT

A fuse or antifuse reading circuit for accurately reading the conductive state of a marginally blown fuse or antifuse in spite of an increasing internal voltage supply. The antifuse reading circuit includes a voltage divider circuit to produce a fuse power supply that has a proportional relationship to the internal voltage supply. The antifuse reading circuit further includes a latch that receives the fuse power supply and produces an output signal indicative of the conductive state of the fuse or antifuse. The latch is set when the fuse or antifuse is not conductive and reset by a latch control circuit when the fuse or antifuse is conductive. The latch control circuit has a variable resistance to compensate for an increasing internal voltage supply. The variable resistance is controlled by a signal with an output level having a proportional relationship to the internal voltage supply that is greater than that for the fuse power supply.

26 Claims, 7 Drawing Sheets

VOLTAGE INDEPENDENT FUSE CIRCUIT AND METHOD

TECHNICAL FIELD

The present invention relates to integrated circuit devices, and more particularly, to antifuse and fuse reading circuits in integrated devices.

BACKGROUND OF THE INVENTION

Typical integrated memory circuits include arrays of memory cells arranged in rows and columns. In many such integrated memory arrays, several redundant rows and columns are provided to be used as substitutes for defective locations in memory. When a defective location is identified, rather than treating the entire array as defective, a redundant row or column is substituted for the defective row or column. This substitution is performed by assigning the address of the defective row or column to the redundant row or column such that, when an address signal corresponding to the defective row or column is received, the redundant row or column is addressed instead.

To make substitution of the redundant row or column substantially transparent to a system employing the memory circuit, the memory circuit includes an address detection circuit. The address detection circuit monitors the row and column addresses and, when the address of a defective row or column is received, enables the redundant row or column instead.

One type of address detection circuit is a fuse-bank address detection circuit. Fuse-bank address detection circuits employ a bank of sense lines where each sense line corresponds to a bit of an address. The sense lines are programmed by blowing fuses in the sense lines in a pattern corresponding to the address of the defective row or column. Addresses are then detected by first applying a test voltage across the bank of sense lines. Then, bits of the address are applied to the sense lines. If the pattern of blown fuses corresponds exactly to the pattern of address bits, the sense lines all block current and the voltage across the bank remains high. Otherwise, at least one sense line conducts and the voltage falls. A high voltage thus indicates the applied address corresponds to a defective row or column.

An alternative address detection circuit employs antifuses in place of conventional fuses. Antifuses are capacitive-type structures that, in their unblown states, form open circuits. Antifuses may be "blown" during programming by applying a high voltage across the antifuse. The high voltage causes the capacitive-type structure to break down, forming a conductive path through the antifuse. Therefore, blown antifuses conduct and unblown antifuses do not conduct. However, due to variations among the individual antifuses, the response to the high-voltage may vary significantly across a particular group. For example, some of the antifuses may blow quickly while other, more robust antifuses may take significantly longer to blow. Consequently, more robust antifuses may be only marginally blown during programming.

Individual antifuses are programmed to form a pattern corresponding to the address of the defective row or column. Generally, the individual antifuses are read by a antifuse reading circuit which generates a digital value or signal indicating whether the antifuse is blown or unblown. The resulting pattern of digital values provides the address of the defective row or column. When a memory device is accessed, the individual antifuses are read and a resulting pattern of the antifuses is compared with an incoming address. If the addresses match, the address detection circuit generates a match signal indicating that the address programmed by the antifuses has been detected. As a result, a redundant row or column is accessed instead of the defective location.

Shown in FIG. 1 is a subsystem 100 of a memory device having a conventional antifuse reading circuit 106 that can be used to read an antifuse 130, and generate a FUSE* signal indicating the blown or unblown state of the antifuse 130. Several elements of the subsystem 100 that are related to programming the antifuse have been omitted from FIG. 1 in the interest of brevity, and are not needed in explaining the reading operation of the conventional antifuse reading circuit 106. An external voltage VCCX is applied to an external terminal 101. An internal power source 102 receives the VCCX voltage and generates an internally regulated voltage VCCR that is used by the internal circuitry of the memory device. The VCCR voltage is provided to a logic circuit 104 that generates an SV signal used during a fuse reading operation, and is also provided to a node 108 of the antifuse reading circuit 106. The internal power source 102 is designed to provide a VCCR voltage that is relatively constant over a predetermined voltage range of the VCCX voltage. Although the VCCR voltage is regulated, it will nevertheless increase when the VCCX voltage increases in the predetermined range, but not to the same degree as the VCCX voltage. The design and operation of the internal power source 102 is well known in the art.

The antifuse reading circuit 106 is enabled by an active low signal FP*. The FP* signal is generated by a control circuit (not shown) and is normally high until a fuse read operation is to be initiated. When the FP* signal goes low, a PMOS transistor 110 couples the VCCR voltage to the antifuse 130 through a PMOS transistor 114, and NMOS transistors 124, 126. A gate of the NMOS transistor 124 receives a signal DVC2E which is slightly greater than one-half of the VCCR supply, and maintains the NMOS transistor 124 in a conductive state. Similarly, a gate of the NMOS transistor 126 receives a boosted voltage VCCP that exceeds the VCCR voltage, and maintains the NMOS transistor 126 in a conductive state. Therefore, for the purposes of reading the conductive state of the antifuse 130, the NMOS transistors 124, 126 will be ON. As mentioned above, when the conductive state of the antifuse 130 is to be read, the logic circuit 104 outputs a high SV signal. The high SV signal turns ON an NMOS transistor 132, thereby coupling the other terminal of the antifuse 130 to a reference voltage, such as a ground node 134. The source of the NMOS transistor 132 is normally coupled to a large negative voltage during programming. However, as mentioned above, circuitry for performing this programming will not be shown or explained in the interest of brevity.

If the antifuse 130 is unblown and remains non-conductive, the antifuse 130 will begin charging and a voltage Vn at a node 122 will increase as the antifuse 130 continues to store charge. The voltage Vn will eventually rise above the threshold voltage of an inverter 118 and trigger the inverter 118 to output a low signal. The output of the inverter 118 is in turn inverted by the inverter 120 to produce a high FUSE* signal indicating that the antifuse 130 is unblown. The gate of a PMOS transistor 112 is also coupled to the output of the inverter 118 and is turned ON when the output signal of the inverter 118 goes low to latch the high signal at the node 122. The PMOS transistor will remain conductive even after the FP* signal returns high to turn OFF the PMOS transistor 110.

On the other hand, if the antifuse 130 is blown such that it conducts current, the node 122 is essentially coupled through the NMOS transistor 132 to the switchable ground node 134 when the FP* signal goes low, despite the VCCR voltage being applied to the node 122 through the PMOS transistors 110, 114. Since the input of the inverter 118 is coupled to the ground node 134, the inverter 118 will output a high signal, turning off the PMOS transistor 112, and the inverter 120 will output a low FUSE* signal indicating that the antifuse 130 is blown. When the FP* signal returns high, the node 122 will still be coupled to the ground terminal and thus, the FUSE* signal will remain low.

Problems with the antifuse reading circuit 106 misreading the conductive state of the antifuse 130 may arise when the antifuse 130 is only marginally blown and the VCCR voltage increases above a certain threshold level. A marginally blown antifuse has a finite resistance of approximately 10–25 kohms that adds to the overall series resistance between the node 122 and the switchable ground terminal 134. Therefore, an increasing VCCR voltage will consequently increase the voltage at the node 122. At some point, the VCCR voltage may increase the voltage at the node 122 enough to trigger the inverter 118, and produce a high FUSE* signal, although the FUSE* signal should be low. The PMOS transistor 112 will be subsequently turned ON, and latch the high signal of the node 122 even after the FP* signal returns high. As previously mentioned, although the internal voltage VCCR is regulated, and has a relatively constant voltage over a predetermined voltage range of the VCCX voltage, the VCCR voltage will nevertheless increase with VCCX throughout that range, but not to the same degree as the VCCX voltage. Thus, a marginally blown antifuse may be read correctly as being blown when the VCCR voltage is at the lower end of the voltage range, but then read incorrectly as being unblown when the VCCR voltage is at the higher end of the voltage range.

In the past, variations in the VCCR voltage have, to some extent, been compensated for by corresponding variations in the SV signal since the SV signal is generated by the logic circuit 104, which, like most of the circuitry in the memory device, is powered by the VCCR voltage. Thus, the magnitude of a high SV signal varies with the magnitude of the VCCR voltage. Increasing the voltage of the SV signal increases the gate-to-source voltage of the NMOS transistor 132, and thus correspondingly reduces the channel resistance of the NMOS transistor 132. As the resistance of the NMOS transistor 132 decreases, the relative voltage level Vn at the node 122 will also decrease and compensate for the increasing voltage across the marginally blown antifuse 130, due to the increasing VCCR supply. However, as the gate-to-source voltage of the NMOS transistor 132 continues to increase, the resistance of the NMOS transistor 132 eventually becomes negligible and will no longer be able to compensate for the increasing voltage across the marginally blown antifuse 130. As the VCCR supply continues to increase beyond this point, the voltage Vn will eventually rise above the threshold voltage of the inverter 118 and the FUSE* signal output by the antifuse reading circuit 100 will erroneously indicate that the antifuse 130 is unblown. Consequently, the resulting digital pattern of programmed antifuses will no longer correspond to the address of the defective memory location.

Therefore, there is a need for a antifuse reading circuit that can accurately determine the conductive state of an antifuse, in spite of an increasing internal voltage supply VCCR.

SUMMARY OF THE INVENTION

A method and apparatus for accurately reading the conductive state of a marginally blown fuse or antifuse, in spite of an increasing internal voltage supply signal. A reading circuit generates a regulated fuse supply signal having a predefined proportionality to the internal supply signal. The reading circuit also receives from a logic circuit a compensation signal having an output level with a predefined proportionality to the internal supply signal that is greater than that for the regulated fuse supply. The fuse supply signal does not increase the same proportion as the output level of the compensation signal, resulting in a reading circuit having a compensation adjustable by the output level of the compensation signal that can compensate for a corresponding increase in the fuse supply signal.

DETAILED DESCRIPTION OF THE INVENTION

Figure 1:
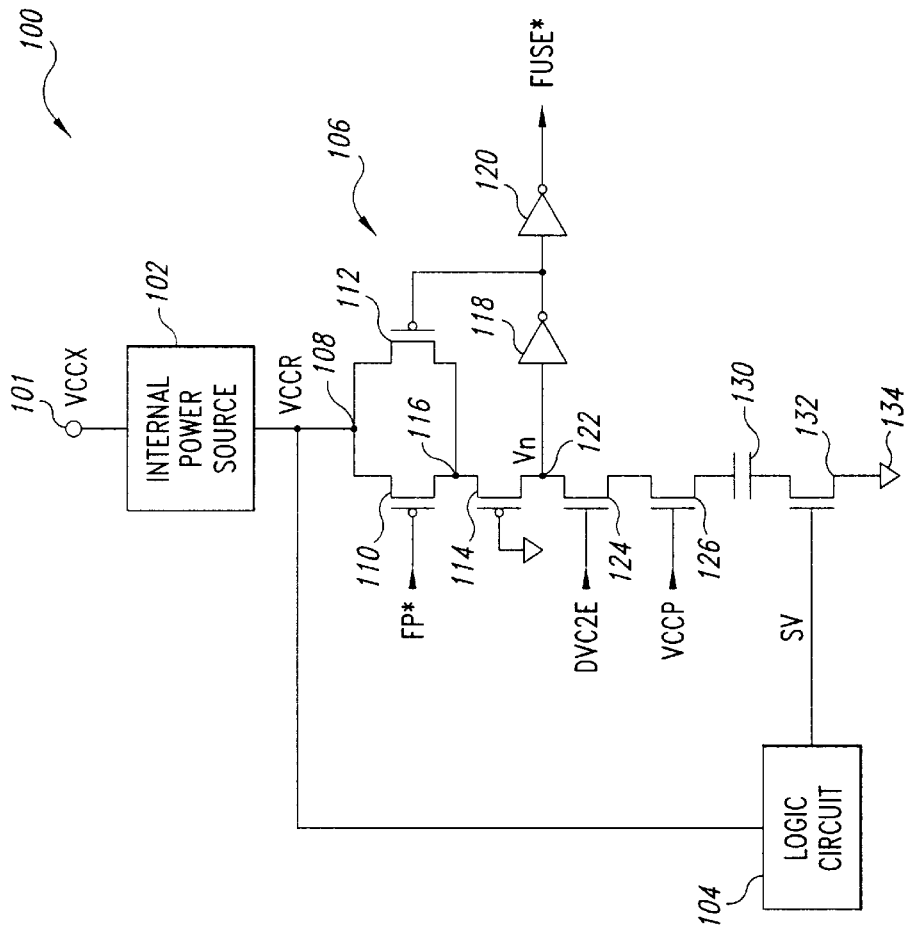
FIG. 1 is a schematic block diagram of a subsystem including a antifuse reading circuit according to the prior art.
Figure 2:
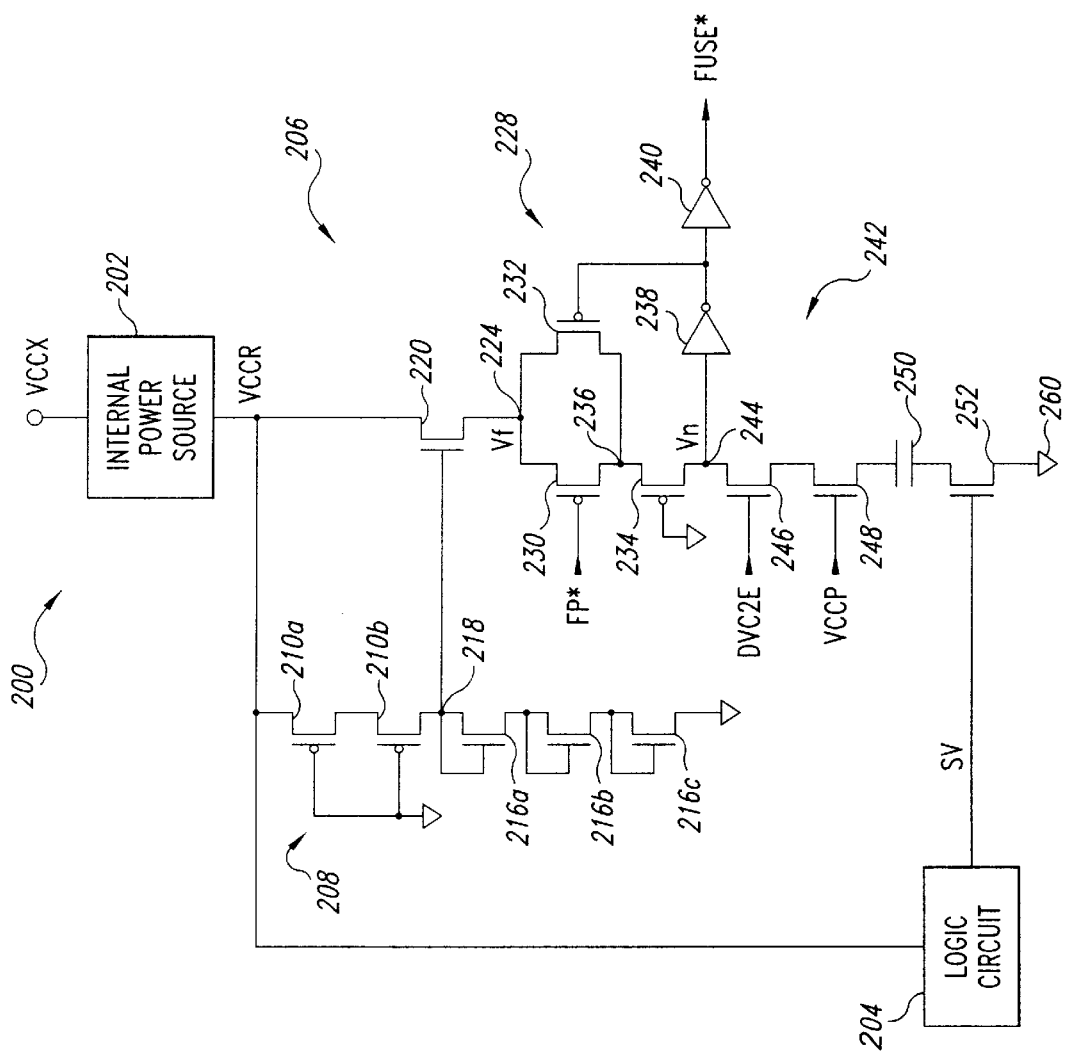
FIG. 2 is a schematic block diagram of a subsystem including a antifuse reading circuit according to an embodiment of the present invention.

Shown in FIG. 2 is a subsystem 200 including a antifuse reading circuit 206 according to an embodiment of the present invention. The subsystem 200 further includes an internal power supply 202 and a logic circuit 204, both operating similarly to the conventional internal power supply 102 and the conventional logic circuit 104, respectively, shown in FIG. 1.

The antifuse reading circuit 206 is formed by a voltage divider circuit 208, a latch 228, and a latch control circuit 242. The voltage divider circuit provides a regulated fuse supply voltage Vf to the latch 228. The latch 228 is set when the antifuse 250 is unblown, and reset when the antifuse 250 is blown. Thus, the output of the latch 228 is indicative of the conductive state of the antifuse 250. As shown in FIG. 2, the accuracy of the antifuse reading circuit 206 is not substantially dependent on the VCCR voltage, unlike the conventional antifuse reading circuits previously described.

As mentioned above, the voltage divider circuit 208 receives the internal voltage VCCR from the internal power supply 202 and generates a regulated fuse supply voltage Vf that is provided to the latch 228. The voltage divider circuit 208 is formed from two PMOS transistors 210a–b and three NMOS transistors 216a–c coupled in series between the VCCR voltage and a ground terminal. The gate terminals of the PMOS transistors 210a–b are coupled together to a ground terminal so that they are always ON. The NMOS transistors 216a–c are diode connected to form active resistive elements. An NMOS transistor 220 has its gate coupled to a node 218, which is at a voltage that is relatively constant, that is, three diode drop voltages of the transistors 216a–c. As a result of the voltage divider circuit 208, the Vf voltage does not fluctuate to the same degree as the VCCR voltage. The relationship between the Vf voltage and the VCCR voltage is determined by the size of the transistors 210a–b, 216a–c, and 220.

A latch 228, which is formed from three PMOS transistors 230, 232, 234 and an inverter 238, is coupled to the drain of the NMOS transistor 220. An inverter 240 is coupled to the output of the inverter 238 to generate an active low fuse signal FUSE*, but would not be needed if an active high fuse signal were acceptable. The first and second PMOS transistors 230, 232 are coupled in parallel with their sources coupled to node 224 and their drains coupled together at node 236. The gate of the PMOS transistor 230 is controlled by the enable signal FP* and the gate of the PMOS transistor 232 is controlled by the output of the inverter 238. A PMOS transistor 234 couples the node 236 to the input of the inverter 238. The transistor 234 is always ON when either of the PMOS transistors 230, 232 is ON because the gate is coupled to a ground terminal. The transistor 234 thus forms a constant resistance path between the node 236 and the input of the inverter 238. In a manner similar to the operation of the latch explained above with respect to FIG. 1, the latch 228 will latch a high signal at the node 244 even after the FP* signal returns high, turning the PMOS transistor 230 OFF.

The latch control circuit 242 is formed from two NMOS transistors 246, 248, coupled in series with an antifuse 250 and an NMOS transistor 252 between the node 244 and a switchable ground terminal 260. During normal operation, the NMOS transistor 246 is turned ON by the device enable signal DVC2E. The DVC2E signal is a conventional, on-chip signal at approximately half of the VCCR voltage. The DVC2E signal varies only slightly with variations of the VCCR voltage, and as a result, the NMOS transistor 246 acts as a current limiter, limiting the current through the latch control circuit 242.

Similarly, the NMOS transistor 248 receives a boosted voltage signal VCCP at its gate terminal that exceeds the VCCR voltage and maintains the NMOS transistor 248 in a conductive state. The NMOS transistor 248 acts as a current limiter to limit the current through the antifuse 250 when being programmed by high voltage. As described above, the process of programming the antifuse requires high voltages and high currents that must be regulated or will cause damage to other transistors. The NMOS transistor 248 limits the amount of current flowing through the latch control circuit 242 when the dielectric layer eventually breaks down.

The NMOS transistor 252 is also ON when the antifuse reading circuit 206 is enabled by the FP* signal, but, as explained above, typically has a variable resistance resulting from variations in the voltage of the SV signal. As will be discussed below, maintaining the proportional relationship between the Vf voltage and the output level of the SV signal reduces the likelihood that the compensation provided by the variable resistance of the transistor 252 will be outpaced by an increase of the Vf voltage supplied to the latch 228 and the latch control circuit 242.

In the configuration shown in FIG. 2, the antifuse reading circuit operates much like the conventional antifuse reading circuit 100 as described above. That is, in summary, when the antifuse 250 is unblown, the voltage at the node 244 increases above the threshold voltage of the inverter 238 and triggers the inverter 238 to output a low signal. The PMOS transistor 232 is turned ON to latch the high signal at the node 244, and the output of the inverter 240 is a high signal indicating that the antifuse in unblown. When the antifuse 250 is blown, the node 244 is coupled to the ground terminal 260 through the NMOS transistors 246, 248, the blown antifuse 250, and the NMOS transistor 252, since the three NMOS transistors 246, 248, 252 are all on during the time the antifuse is being read. Consequently, the antifuse reading circuit 206 will produce a low output signal. However, in the case where the antifuse is only marginally blown and has a finite resistance, the antifuse reading circuit 206 is less susceptible than a conventional antifuse reading circuit to misreading a marginally blown antifuse as being unblown when the VCCR voltage is relatively high.

As mentioned previously, the Vf voltage provided by the voltage divider circuit 208 is a regulated voltage that does not fluctuate to the same degree as the VCCR voltage. As also mentioned previously, the SV signal has an output level that increases and decreases in direct proportion with the VCCR voltage. Consequently, when the FP* signal enables the latch 228, any increase of the voltage Vn, corresponding to an increase of the Vf voltage, will be easily compensated by a decrease in the resistance of the NMOS transistor 252 resulting from the increasing voltage level of the SV signal. Thus, the voltage Vn will remain below the threshold voltage of the inverter 238, and the FUSE* signal will continue to be low, even though the marginally blown antifuse acts as a resistor of approximately 10–25 kohm and the VCCR voltage is increasing.

Figure 3A:
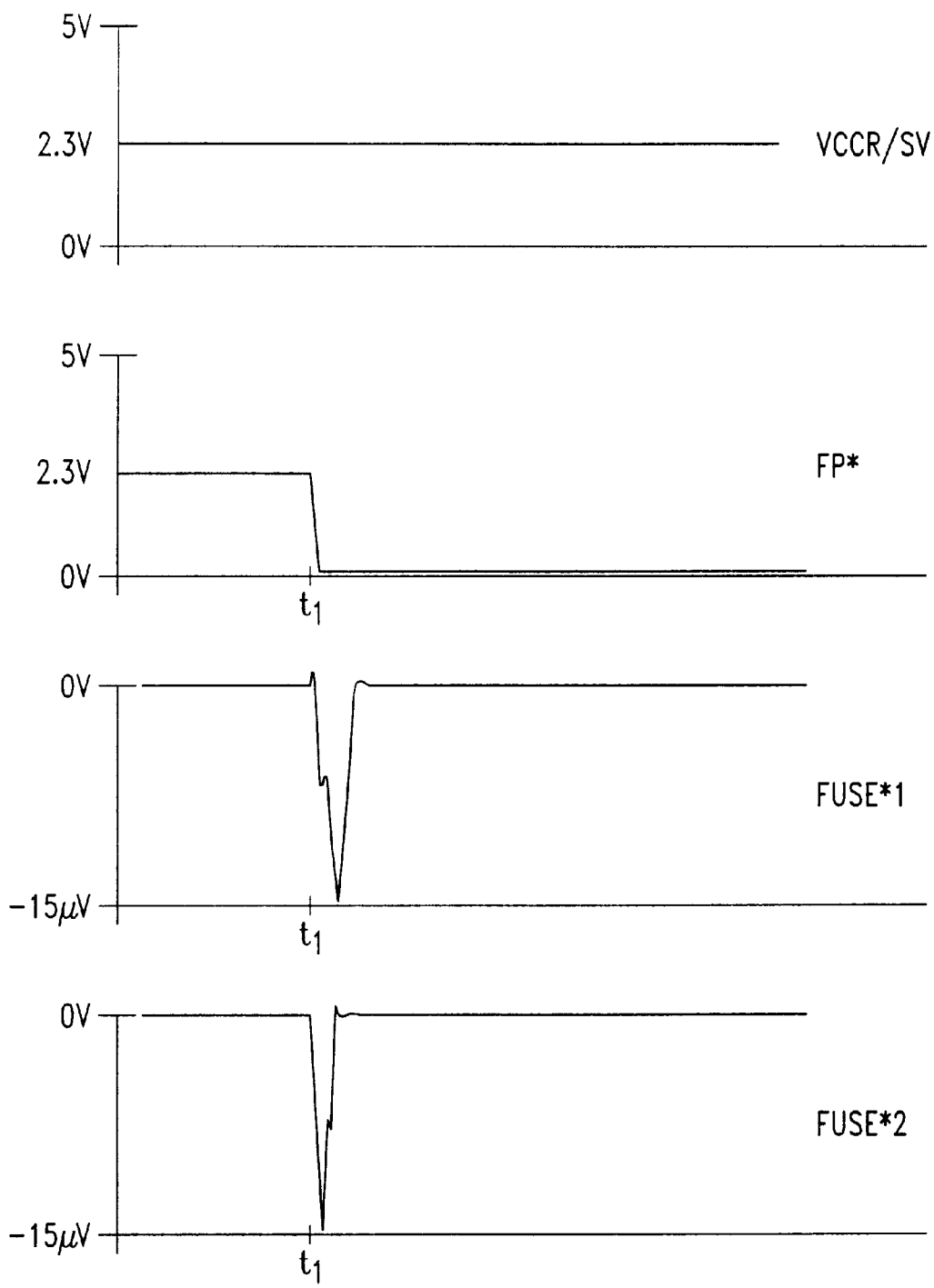
FIGS. 3A–C are voltage diagrams showing the voltages of various signals during the reading step of a antifuse reading circuit according to the prior art and according to the embodiment of the present invention illustrated in FIG. 2.
Figure 3B:
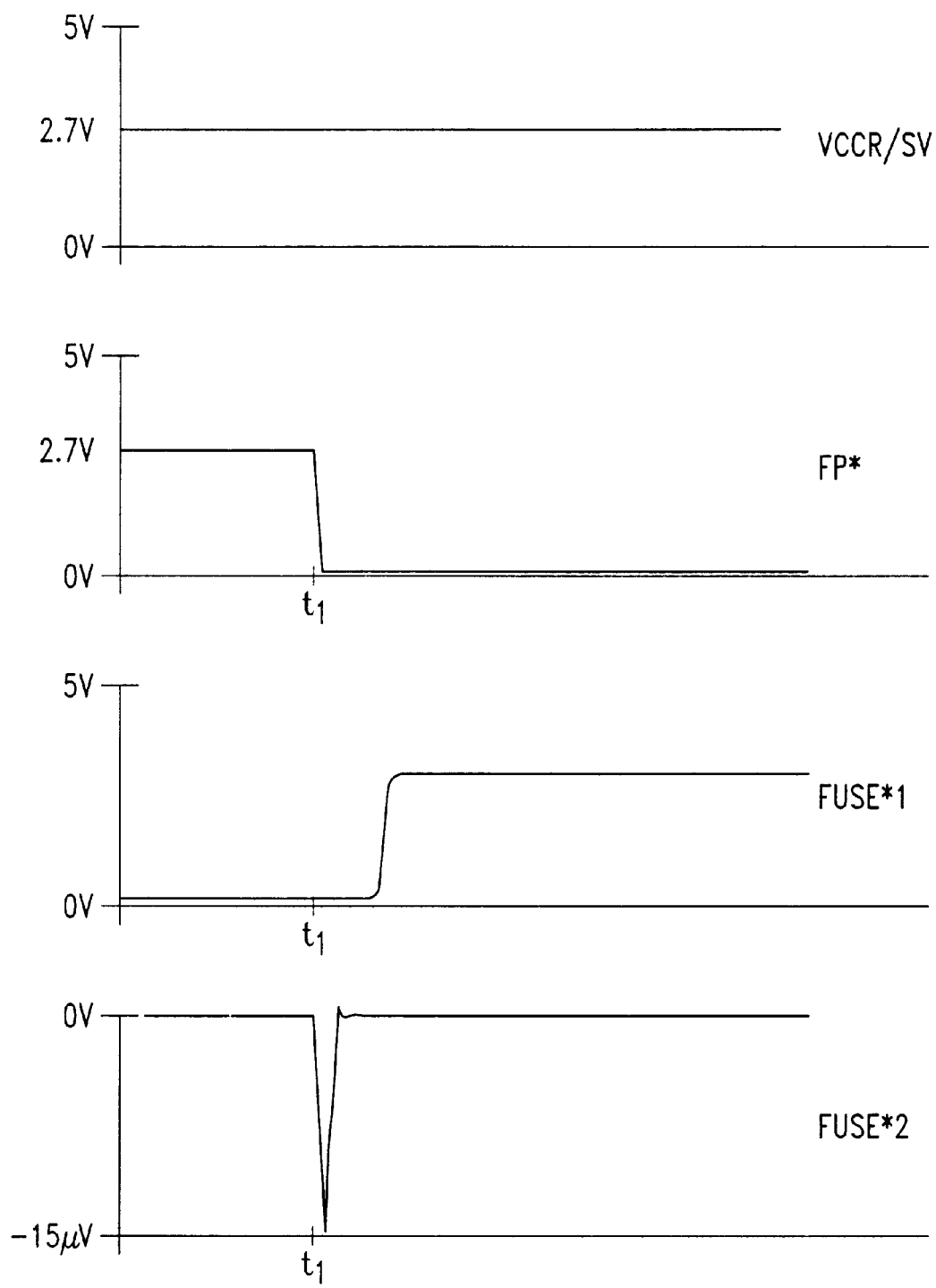
Figure 3C:
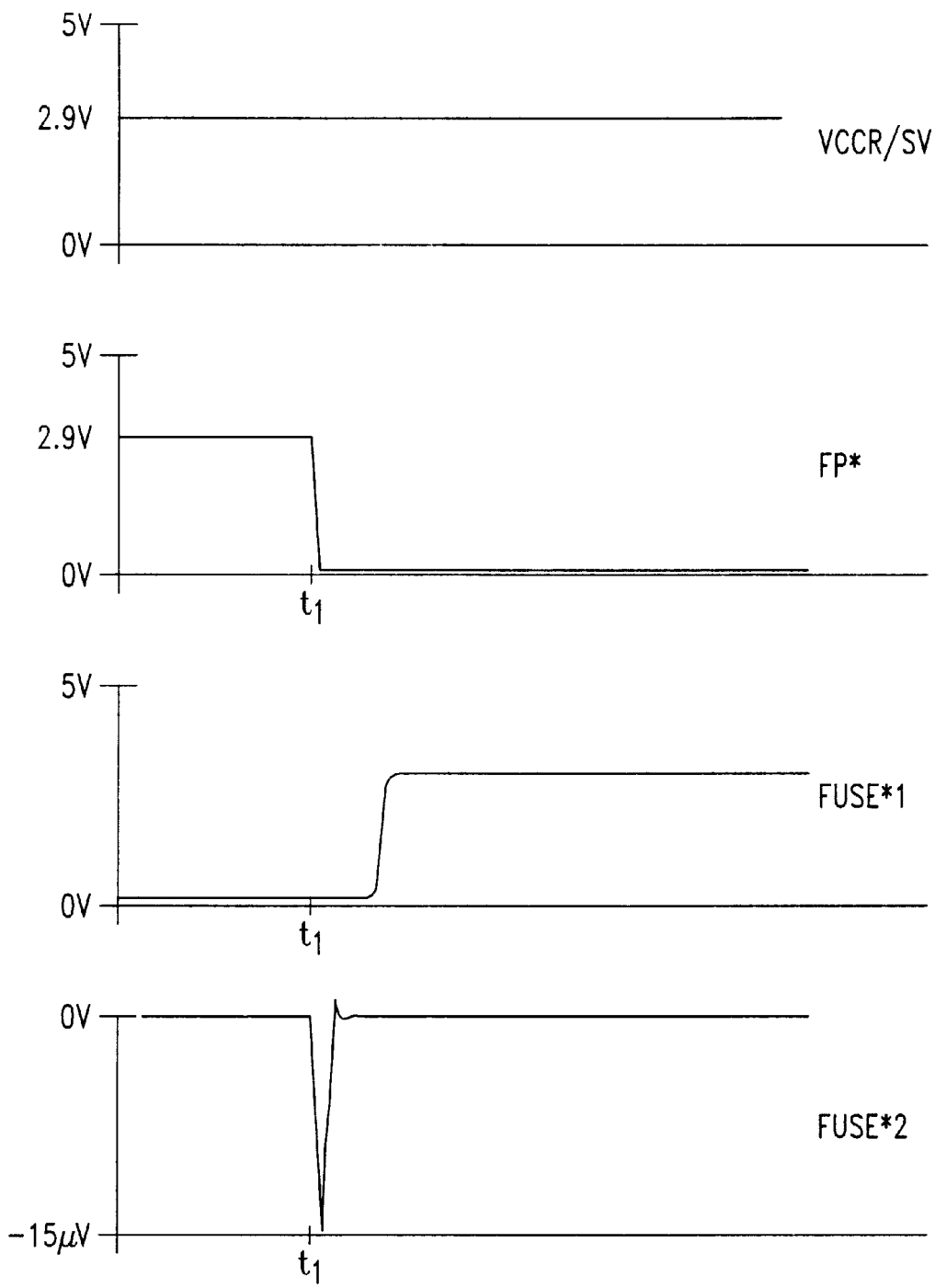

FIGS. 3A–C are graphs comparing the performance of the conventional antifuse reading circuit 106 (producing the signal FUSE*1) to the antifuse reading circuit 206 (producing the signal FUSE*2) for increasing values of the VCCR voltage. The marginally blown antifuse is modeled as a 25 kohm resistor. As shown in FIG. 3A, when the VCCR voltage is 2.3 volts, and consequently the voltage of the SV signal is also 2.3 volts, both the conventional antifuse reading circuit 106 and the antifuse reading circuit 206 correctly read the state of the antifuse as being programmed. However, as shown in FIG. 3B, when the VCCR voltage, and correspondingly the SV signal, are increased to 2.7 volts, the conventional antifuse reading circuit 106 misreads the antifuse as being unprogrammed and erroneously generates a FUSE* 1 signal that is high. In contrast, the antifuse reading circuit 206 still reads the antifuse as being programmed, and correctly produces a FUSE*2 signal that is low. Similarly, when the VCCR voltage and the voltage of the SV signal are increased to 2.9 volts, as shown in FIG. 3C, the conventional antifuse reading circuit 106 again misread the state of the antifuse, while the antifuse reading circuit 206 continues to correctly read the antifuse as being programmed.

Although described herein as a antifuse reading circuit 206 reading the conductive state of an antifuse, the principles of the present invention are applicable to a variety of programmable coupling devices including, but not limited to, fuses, floating gate cells, and the like. Accordingly, the present invention is not limited by the specific form of programmable coupling device. Furthermore, a voltage divider circuit 208 may be used to produce a Vf voltage that decreases proportionally with an increasing VCCR voltage over a predetermined voltage range, as long as the proportionality of the Vf voltage is less than that for the output level of the SV signal. Therefore, voltage divider circuits other than the specific form of the voltage divider circuit 208 may be used.

Figure 4:
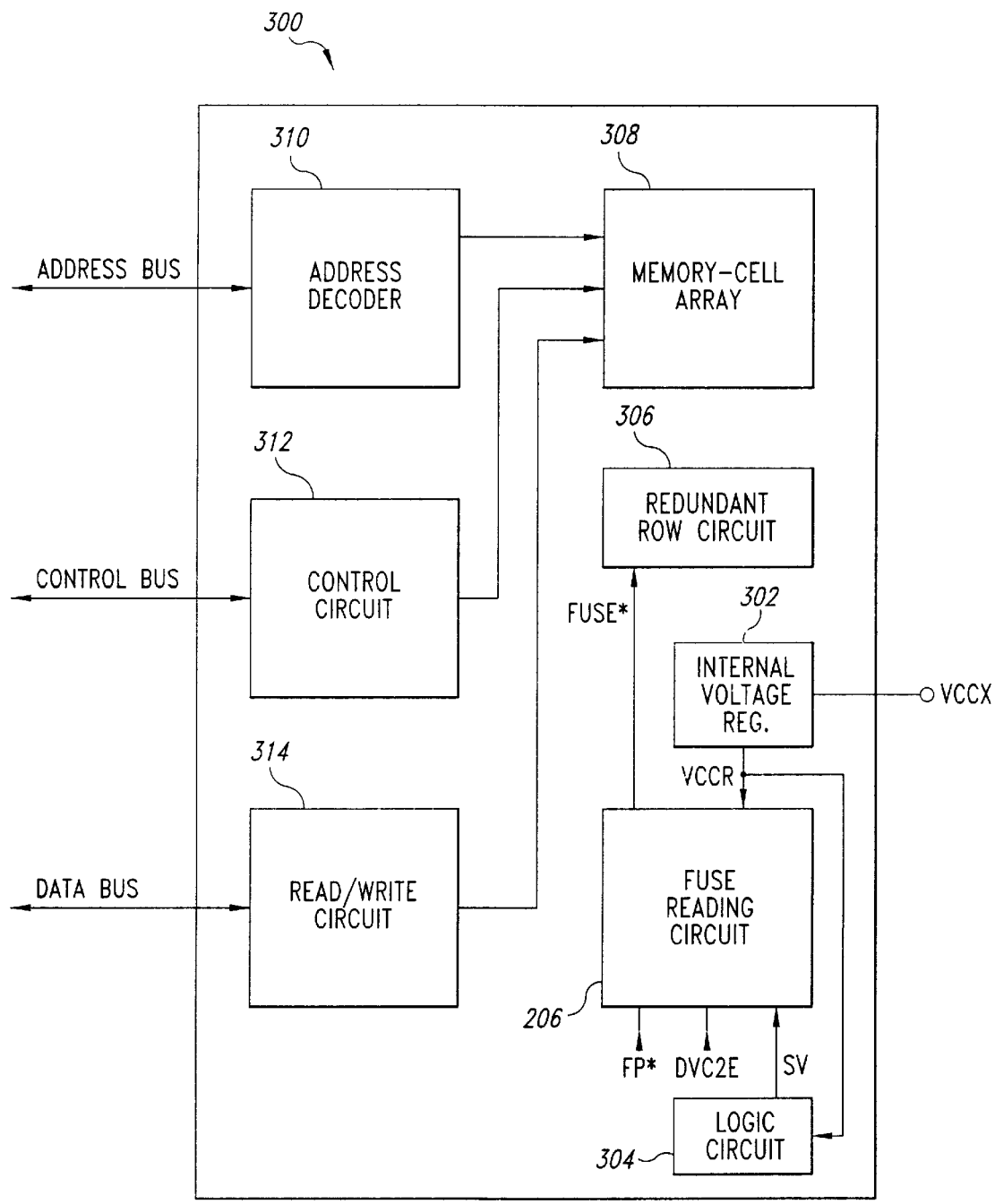
FIG. 4 is a block diagram of a memory device that includes the antifuse reading circuit illustrated in FIG. 2.

FIG. 4 is a block diagram of a memory device 300 which includes the antifuse reading circuit 206 of FIG. 2. An internal voltage regulator 302 receives an external voltage VCCX and generates a regulated internal voltage VCCR. The VCCR voltage is provided throughout the memory device 300 to power internal circuitry. Operation of the internal voltage regulator 302 is of a conventional manner and is understood by one skilled in the art. The antifuse reading circuit 206 is shown as receiving the VCCR voltage, and the FP* and DVC2E signals to activate the antifuse reading operation. The antifuse reading circuit 206 also receives an SV signal from a logic circuit 304 powered by the VCCR voltage to compensate for an increasing supply level. The output of the antifuse reading circuit 206 is coupled to provide a FUSE* signal to a redundant row circuit 306 containing a plurality of redundant memory cells that are used to replace defective memory cells in a memory cell array 308. The memory device 300 further includes an address decoder 310, control circuit 312, and read/write circuitry 314, all of which are conventional. The address decoder 310, control circuit 312, and read/write circuitry 314 are all coupled to the memory cell array 308. In addition, the address decoder 310 is coupled to an address bus, the control circuit 312 is coupled to a control bus, and the read/write circuit 314 is coupled to a data bus.

In operation, internal circuitry (not shown) controls operation of the memory device including the reading circuit 206 to read the antifuse 250 (FIG. 2). When the input FP* is active, the antifuse reading circuit 206 reads the state of the antifuse 250 and generates the FUSE* signal to indicate whether the antifuse 250 has been blown. The FUSE* signal is provided to the redundant row circuit 306. When the antifuse 250 has been blown, the FUSE* signal is low and the circuit 306 operates to replace a row of memory cells in the array 308 with redundant memory cells contained within the circuit 306. Operation of the address decoder 310, control circuit 312, and read/write circuit 314 during read and write data transfer operations is conventional and understood by one skilled in the art.

Figure 5:
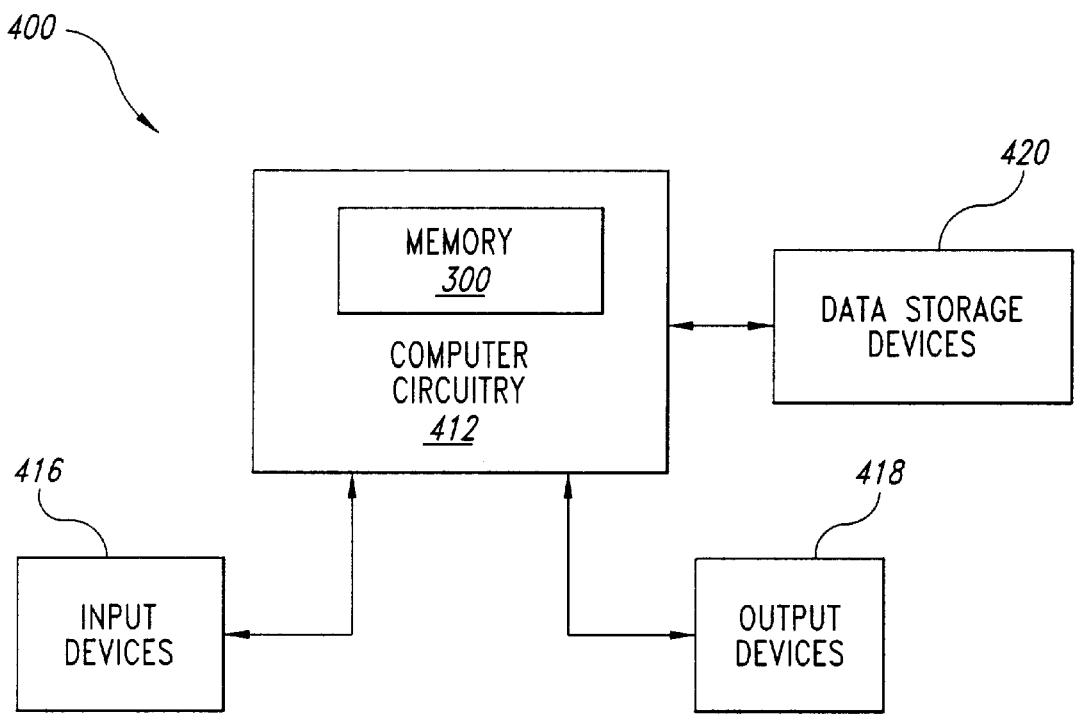
FIG. 5 is a block diagram of a computer system that includes the memory device of FIG. 4.

FIG. 5 is a block diagram of a computer system 400 which includes the memory device 300 of FIG. 4. The computer system 400 includes computer circuitry 412 for performing various computing functions, such as executing specific software to perform specific calculations or tasks. In addition, the computer system 400 includes one or more input devices 416, such as a keyboard or a mouse, coupled to the computer circuitry 412 to allow an operator to interface with the computer system. Typically, the computer system 400 also includes one or more output devices 418 coupled to the computer circuitry 412, such output devices typically being a printer or a video terminal. One or more data storage devices 420 are also typically coupled to the computer circuitry 412 to store data or retrieve data from external storage media (not shown). Examples of typical storage devices 420 include hard and floppy disks, tape cassettes, and compact disc read-only memories (CD-ROMs). The computer circuitry 412 is typically coupled to the memory device 300 through a control bus, a data bus, and an address bus to provide for writing data to and reading data from the memory device.

It is to be understood that even though various embodiments and advantages of the present invention have been set forth in the foregoing description, the above disclosure is illustrative only, and changes may be made in detail, and yet remain within the broad principles of the invention. For example, the antifuse reading circuit may be modified to produce an active high FUSE* signal instead of an active low FUSE* signal by removing the inverter 240 (FIG. 2). Therefore, the present invention is to be limited only by the appended claims.

What is claimed is:

1. A memory device receiving from an external power source an external power signal having increasing and decreasing variance, the memory device comprising:

an internal power source having an input terminal coupled to the external power source to receive the external power signal and an output terminal to provide an internal power signal having a voltage proportional with the voltage of the external power signal;

a logic circuit having an input coupled to the output of the internal power source and an output terminal providing a compensation signal having an output level with a first proportionality to the internal power signal;

a voltage regulator having an input coupled to the output of the internal power source and an output terminal providing a supply signal having a second proportionality to the internal power signal that is less than the first proportionality;

a programmable coupling device; and a continuity detecting circuit coupled to the programmable coupling device and having a supply terminal coupled to the output of the voltage regulator, a compensation terminal coupled to the output of the logic circuit, a control terminal coupled to receive an activation signal, and an output terminal, the continuity detecting circuit generating at the output terminal when activated an indicator signal having a first logic level if the programmable coupling device is electrically continuous and having a second logic level if electrically discontinuous.

2. The memory device according to claim 1 wherein the continuity detecting circuit comprises:

a latch coupled to receive the supply signal and structured to output the indicator signal according to the conductivity of the programmable coupling device; and a latch control circuit coupled to set and reset the latch, the latch control circuit setting the latch when the programmable coupling device is electrically continuous, and resetting the latch when the programmable coupling device is electrically discontinuous.

3. The memory device according to claim 1 wherein the programmable coupling device is an antifuse.

4. The memory device according to claim 1 wherein the second proportionality is a decreasing proportionality over a predetermined range of an increasing internal power signal.

5. The memory device according to claim 1 wherein the voltage regulator comprises a voltage divider circuit having resistive elements.

6. The memory device according to claim 1 wherein the voltage regulator comprises a chain of series connected transistors coupled between the output terminal of the internal power source and a reference voltage supply.

7. A memory device receiving from an external power source an external power signal having increasing and decreasing variance, the memory device comprising:

an internal power source having an input terminal coupled to the external power source to receive the external power signal and an output terminal to provide an internal power signal having a voltage proportional with the voltage of the external power signal;

a logic circuit having an input coupled to the output of the internal power source and an output terminal providing a compensation signal having an output level with a first proportionality to the internal power signal;

a voltage regulator having an input coupled to the output of the internal power source and an output terminal providing a supply signal having a second proportionality to the internal power signal that is less than the first proportionality; and a voltage divider circuit formed in part by a programmable impedance element and in part by a variable resistor having a resistance adjustable by the output level of the compensation signal, the voltage divider circuit coupled between the output terminal of the voltage regulator and a reference voltage terminal to provide a bias value at a measurement node indicative of the conductivity of the programmable impedance element.

8. The memory device according to claim 7 wherein the programmable impedance element is an antifuse.

9. The memory device according to claim 7 wherein the voltage divider circuit further comprises a plurality of active resistive elements coupled in series between the output terminal of the voltage regulator and the programmable impedance element.

10. The memory device according to claim 7 wherein the voltage divider circuit further comprises:
   first and second PMOS transistors coupled in series between the voltage regulator and the measurement node;
   a third PMOS transistor coupled parallel to the first PMOS transistor, having a source terminal coupled to the output terminal of the voltage regulator, a drain terminal coupled between the first and second PMOS transistors, and a control terminal;
   an inverter having an input coupled to the measurement node and an output coupled to the control terminal of the third PMOS transistor, the inverter produces at the output terminal a signal indicative of the conductivity of the programmable impedance element; and
   first and second NMOS transistors coupled in series between the measurement node and the programmable impedance element.

11. The memory device according to claim 7 wherein the second proportionality is decreasing proportionality over a predetermined range of an increasing internal power signal.

12. A computer system comprising:
   a processor having a processor bus;
   and input device coupled to the processor through the processor bus and adapted to allow data to be entered into the computer system;
   an output device coupled to the processor through the processor bus and adapted to allow data to the output from the computer system; and
   a memory device coupled to the processor for the processor bus and receiving from an external power source an external power signal having increasing and decreasing variance, the memory device comprising:
      an internal power source having an input terminal coupled to the external power source to receive the external power signal and an output terminal to provide an internal power signal having a voltage proportional to the voltage of the external power signal;
      a logic circuit having an input coupled to the output of the internal power source and an output terminal providing a compensation signal having an output level with a first proportionality to the internal power signal;
      a voltage regulator having an input coupled to the output of the internal power source and an output terminal providing a supply signal having a second proportionality to the internal power signal that is less than the first proportionality;
      a programmable coupling device; and
      a continuity detecting circuit coupled to the programmable coupling device and having a supply terminal coupled to the output of the voltage regulator, a compensation terminal coupled to the output of the logic circuit, a control terminal coupled to receive an activation signal, and an output terminal, the continuity detecting circuit generating at the output terminal when activated an indicator signal having a first logic level if the programmable coupling device is electrically continuous and having a second logic level if electrically discontinuous.

13. The computer system of claim 12 wherein the continuity detecting circuit comprises:
   a latch coupled to receive the supply signal and structured to output the indicator signal according to the conductivity of the programmable coupling device; and
   a latch control circuit coupled to set and reset the latch, the latch control circuit setting the latch when the programmable coupling device is electrically continuous, and resetting the latch when the programmable coupling device is electrically discontinuous.

14. The computer system according to 12 wherein the programmable coupling device is an antifuse.

15. The computer system according to claim 12 wherein the second proportionality is a decreasing proportionality over a predetermined range of an increasing internal power signal.

16. The computer system according to claim 12 wherein the voltage regulator comprises a chain of series connected transistors coupled between the output terminal of the internal power source and a reference voltage supply.

17. A method of reading a programmable coupling device in an integrated circuit, the method comprising:
   generating a first regulated voltage using an internal voltage regulator;
   powering a reading circuit with a second regulated voltage having a first proportionality to the first regulated voltage; and
   providing a control signal having an output level with a second proportionality to the first regulated voltage that is greater than the first proportionality to the reading circuit.

18. The method according to claim 17 wherein powering the reading circuit comprises:
   generating an adjustment signal having a voltage relationship with the first regulated voltage determined by a voltage divider circuit; and
   adjusting a variable resistance element to regulate the first regulated voltage according to the voltage of the adjustment signal.

19. The method according to claim 18 wherein generating the adjustment signal comprises reducing the voltage of the first regulated voltage by a fraction determined by a chain of series connected resistive elements.

20. The method according to claim 18 further comprising compensating for an increasing second regulated voltage using the control signal.

21. The method according to claim 20 wherein compensating for an increasing second regulated voltage comprises reducing a resistance of a variable resistor in the reading circuit in proportion to the voltage of the control signal.

22. A memory device receiving from an external power source an external power signal having increasing and decreasing variance, the memory device comprising:
   an internal power source having an input terminal coupled to the external power source to receive the external power signal and an output terminal to provide an internal power signal having a voltage proportional with the voltage of the external power signal;

a logic circuit having an input coupled to the output of the internal power source and an output terminal providing a compensation signal having a voltage having a first proportionality with the voltage of the internal power signal;

a voltage regulator having a plurality of series connected resistive elements coupled between the output of the internal power source and a reference voltage terminal and further having a node interposed between a first and second resistive element of the plurality of resistive elements, the voltage regulator providing a supply signal at the node having a voltage with a second proportionality to the voltage of the internal power signal that is less than the first proportionality; and a voltage divider circuit formed in part by a programmable impedance element and in part by first and second variable resistors, the first variable resistor having a control terminal coupled to the node and a resistance adjustable by the voltage of the supply signal, the second variable resistor having a resistance adjustable by the voltage of the compensation signal, the voltage divider circuit coupled between the output terminal of the internal power source and the reference voltage terminal to provide a bias value at a measurement node indicative of the conductivity of the programmable impedance element.

23. The memory device according to claim 22 wherein the programmable impedance element is an antifuse.

24. The memory device according to claim 22 wherein the voltage divider circuit further comprises a plurality of active resistive elements coupled in series between the first resistive element and the programmable impedance element.

25. The memory device according to claim 22 wherein the voltage divider circuit further comprises:

first and second PMOS transistors coupled in series between the first resistive element and the measurement node;

a third PMOS transistor coupled parallel to the first PMOS transistor, having a source terminal coupled to the output terminal of the voltage regulator, a drain terminal coupled between the first and second PMOS transistors, and a control terminal;

an inverter having an input coupled to the measurement node and an output coupled to the control terminal of the third PMOS transistor, the inverter produces at the output terminal a signal indicative of the conductivity of the programmable impedance element; and first and second NMOS transistors coupled in series between the measurement node and the programmable impedance element.

26. The memory device according to claim 22 wherein the second proportionality is decreasing proportionality over a predetermined range of an increasing internal power signal.

* * * * *